(12) United States Patent
Yamada et al.

(10) Patent No.: US 8,514,617 B2
(45) Date of Patent: Aug. 20, 2013

(54) MAGNETIC MEMORY ELEMENT AND STORAGE DEVICE USING THE SAME

(75) Inventors: Michiya Yamada, Hino (JP); Yasushi Ogimoto, Higashiyamato (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 84 days.

(21) Appl. No.: 13/263,734

(22) PCT Filed: Mar. 17, 2010

(86) PCT No.: PCT/JP2010/054487
§ 371 (c)(1),
(2), (4) Date: Dec. 8, 2011

(87) PCT Pub. No.: WO2010/134378
PCT Pub. Date: Nov. 25, 2010

(65) Prior Publication Data
US 2012/0075922 A1    Mar. 29, 2012

(30) Foreign Application Priority Data

May 19, 2009 (JP) ................... 2009-120855

(51) Int. Cl.
G11C 11/00  (2006.01)
G11C 5/08   (2006.01)
G11C 11/14  (2006.01)

(52) U.S. Cl.
USPC .............. 365/158; 365/66; 365/171; 365/173

(58) Field of Classification Search
USPC .................... 365/158, 66, 171, 173
See application file for complete search history.

(56) References Cited

U.S. PATENT DOCUMENTS

| 6,483,741 | B1 | 11/2002 | Iwasaki et al. |
| 2005/0036361 | A1 | 2/2005 | Fukuzumi |
| 2005/0106810 | A1* | 5/2005 | Pakala et al. ................. 438/257 |

(Continued)

FOREIGN PATENT DOCUMENTS

| JP | 2001-084756 A | 3/2001 |
| JP | 2005-064050 A | 3/2005 |

(Continued)

OTHER PUBLICATIONS

Djayaprawira, D.D. et al., "230% room temperature magnetoresistance in CoFeB/MgO/CoFeB magnetic tunnel junctions", Applied Physics Letters, vol. 86, No. 9, Feb. 2005, pp. 092502-1 ~ 092502-3.

(Continued)

*Primary Examiner* — Ly D Pham
(74) *Attorney, Agent, or Firm* — Rabin & Berdo, P.C.

(57) ABSTRACT

A magnetic memory element capable of maintaining high thermal stability (retention characteristics) while reducing a writing current. The magnetic memory element includes a magnetic tunnel junction having a first magnetic body including a perpendicular magnetization film, an insulating layer, and a second magnetic body serving as a storage layer including a perpendicular magnetization film, which are sequentially stacked. A thermal expansion layer is disposed in contact with the magnetic tunnel junction portion. The second magnetic body is deformed in a direction in which the cross section thereof increases or decreases by the thermal expansion or contraction of the thermal expansion layer due to the flow of a current, thereby reducing a switching current threshold value required to change the magnetization direction.

16 Claims, 13 Drawing Sheets

(56) References Cited

U.S. PATENT DOCUMENTS

| | | |
|---|---|---|
| 2005/0189574 A1 | 9/2005 | Nguyen et al. |
| 2007/0297220 A1 | 12/2007 | Yoshikawa et al. |
| 2008/0164502 A1 | 7/2008 | Fukumoto et al. |
| 2011/0170339 A1* | 7/2011 | Wunderlich et al. .......... 365/158 |

FOREIGN PATENT DOCUMENTS

| | | |
|---|---|---|
| JP | 2005-123488 A | 5/2005 |
| JP | 2007-004901 A | 1/2007 |
| JP | 2007-525847 A | 9/2007 |
| JP | 2008-028362 A | 2/2008 |
| WO | WO-2006-054588 A1 | 5/2006 |

OTHER PUBLICATIONS

Lee, D.H. et al., "Increase of temperature due to Joule heating during current-induced magnetization switching of an MgO-based magnetic tunnel junction", Applied Physics letters, vol. 92, No. 23, Jun. 2008, pp. 233502-1 ~ 233502-3.

Hayakawa, J. et al., "Current-Induced Magnetization Switching in MgO Barrier Magnetic Tunnel Junctions With CoFeB/Ru/CoFeB Synthetic Ferrimagnetic Free Layers", JJAP Express Letter, vol. 45, No. 40, Oct. 2006, pp. L1057-L1060.

* cited by examiner

MAGNETIC MEMORY ELEMENT AND STORAGE DEVICE USING THE SAME

TECHNICAL FIELD

The present invention relates to a magnetic memory element for reading data using a magnetoresistive effect and a nonvolatile storage device using the magnetic memory element.

BACKGROUND ART

In recent years, the capacity of a nonvolatile semiconductor storage device whose representative example is a flash memory has increased significantly and a product with a capacity of several hundreds of gigabytes has been released. The nonvolatile semiconductor storage device has a high commercial value as, particularly, a USB memory or a storage device for a mobile phone and is useful as a storage device for a portable music player since it has the advantages of a solid-state element memory, such as vibration resistance, high reliability, and low power consumption. Therefore, the nonvolatile semiconductor storage device has been mainly used as a storage device for a portable or mobile electronic apparatus for music and images.

In addition to the application of the storage device, a computer in which nonvolatility is given to a DRAM that is being currently used as the main memory of an information apparatus and which instantly starts up in use and consumes little power in a standby state, that is, a so-called "instant on computer" has been actively studied. In order to achieve the computer, a nonvolatile memory satisfying requirements (1) a switching speed of less than 50 ns and (2) the number of rewriting operations more than $10^{16}$, which are technical specifications required for the DRAM, is needed.

As the candidates of the next-generation nonvolatile semiconductor storage device, nonvolatile memory elements based on various kinds of principles, such as a ferroelectric memory (FeRAM), a magnetic memory (MRAM), and a phase-change memory (PRAM), have been studied and developed. However, the MRAM is looking very promising as the candidate satisfying the technical specifications for replacing the DRAM. Among the technical specifications, the number of rewriting operations (>$10^{16}$) is considered on the basis of the number of accesses when an access operation is continuously performed at 30 ns for 10 years. In the case of a nonvolatile memory, since a refresh cycle is not needed, the number of accesses is not necessarily needed. The MRAM has already cleared a rewriting number function of $10^{12}$ or more, which is a trial level, and a high switching speed (<10 ns). Therefore, it is considered that the feasibility of the MRAM is more than that of other nonvolatile storage devices.

The first problem of the MRAM is a large cell area and high writing energy. An MRAM with a low capacity of about 4 Mbit that is currently commercially available is a current magnetic field rewriting type and has a very large cell area of 20 $F^2$ to 30 $F^2$ (F is the minimum feature size of a manufacturing process). Therefore, the low-capacity MRAM is not suitable for a technique replacing the DRAM. In order to solve these problems, there are two breakthroughs. One of the two breakthroughs is an MTJ (magnetic tunnel junction) using a MgO tunnel insulating film, which is a technique capable of easily obtaining a magnetic resistance of 200% or more (for example, see Non-patent Literature 1). The other breakthrough is a current induced magnetization reversal method (hereinafter, referred to as an STT), which is a technique capable of solving the problem of the reversal magnetic field being increased in a micro-cell which is a significant problem in the current magnetic field rewriting type, and reducing the writing energy by scaling. The current induced magnetization reversal type can ideally achieve a one-transistor-one-MTJ structure. Therefore, it is considered that the cell area of the MRAM is from 6 $F^2$ to 8 $F^2$, which is equal to that of the DRAM (for example, see Patent Literature 1 and Non-patent Literature 2).

The operation of the MRAM according to the related art will be described in brief with reference to FIG. 12. FIG. 12 is an enlarged cross-sectional view illustrating a portion of a storage device 10' including a magnetic memory element 1'. However, the storage device 10' shown in FIG. 12 has the same operation as that disclosed in Patent Literature 1.

The magnetic memory element 1' includes a magnetic tunnel junction (MTJ) portion 13. The MTJ portion 13 is interposed between a lower electrode 14 and an upper electrode 12. The MTJ portion 13 has a structure in which a pinned layer 22 (first magnetic body), an insulating layer 21, and a storage layer 20 (second magnetic body) are sequentially stacked from the lower side (the side of the lower electrode 14) to the upper side (the side of the upper electrode 12). The pinned layer 22 and the storage layer 20 are perpendicular magnetization films. The lower electrode 14 is formed on a drain region 24 of a substrate 15 and a source region 25 is formed in the substrate 15 so as to be separated from the drain region 24. A gate line 16 is formed above the drain region 24 and the source region 25 so as to be insulated therefrom. The drain region 24, the source region 25, and the gate line 16 form a MOS-FET. In addition, a contact portion 17 and a word line 18 are sequentially stacked on the source region 25 and the word line 18 is connected to a control circuit (not shown). The upper electrode 12 is connected to a bit line 11 and the bit line 11 is connected to the control circuit (not shown). The bit line 11 and the word line 18 are insulated from each other by an interlayer insulating film 23.

Next, the principle of the operation of the magnetic memory element 1' according to the related art will be described with reference to FIG. 13. FIG. 13 is an enlarged view illustrating the MTJ portion 13 shown in FIG. 12.

In the magnetic memory element 1' configured as shown in FIG. 12, a resistance value varies depending on the magnetization direction of the storage layer 20 relative to the pinned layer 22 (TMR effect). Specifically, when the magnetization direction of the storage layer 20 is opposite to that of the pinned layer 22 as shown in FIG. 13(a), the insulating layer 21 is in a high resistance state. When the magnetization direction of the storage layer 20 is the same as that of the pinned layer 22 as shown in FIG. 13(b), the insulating layer 21 is in a low resistance state. The high resistance state corresponds to "0" and the low resistance state corresponds to "1" from the above-mentioned point. The magnetization state (data) of the storage layer 20 is read as a resistance value, which is the principle of a reading operation (see Non-patent Literature 1).

For a writing operation, as shown in FIG. 13(a), when a current 103 flows from the storage layer 20 to the pinned layer 22, the storage layer 20 is changed from the high resistance state to the low resistance state shown in FIG. 13(b). When a current flows in the opposite direction in the low resistance state, the storage layer 20 is changed from the low resistance state to the high resistance state shown in FIG. 13(a). This is the principle of the writing operation (see Non-patent Literature 2).

As described above, the storage device 10' selects a MOS-FET using the magnetic memory element 1', reads information stored in the magnetic memory element 1', and writes information to the magnetic memory element 1'.

CITATION LIST

Patent Literature

Patent Literature 1: Japanese Patent Application Laid-Open (JP-A) No. 2008-28362

Non-Patent Literature

Non-patent Literature 1: D. D. Djayaprawira, et al., "230% room-temperature magnetoresistance in CoFeB/MgO/CoFeB magnetic tunnel junctions," Applied Physics Letters, Vol. 86, 092502, 2005

Non-patent Literature 2: J. Hayakawa, et al., "Current-induced magnetization switching in MgO barrier based magnetic tunnel junctions with CoFeB/Ru/CoFeB synthetic ferrimagnetic free layer," Japanese Journal of Applied Physics, Vol. 45, L1057-L1060, 2006

Non-patent Literature 3: D. H. Lee, et al., "Increase of temperature due to Joule heating during current-induced magnetization switching of an MgO-based magnetic tunnel junction," Applied Physics Letters, Vol. 92, 233502, 2008

DISCLOSURE OF INVENTION

Problem to be Solved by the Invention

The writing current of the magnetic memory element according to the related art is reduced a little by the STT method, but is still large. Therefore, it is preferable to further reduce the writing current. This problem will be described below. A switching current threshold value required for writing is calculated by the following Expression 1:

$$Jc \propto \alpha Ms VHk \qquad \text{[Expression 1]}$$

(where Ms is the amount of magnetization of the storage layer, Hk is the anisotropic magnetic field of the storage layer, α is a damping constant, and V is a volume). As can be seen from Expression 1, in order to reduce a switching current Jc, it is necessary to reduce any one of the parameters Ms, V, and Hk. However, when the volume V or the anisotropic magnetic field Hk is reduced, thermal stability that is directly related to the period for which magnetization (data) can be maintained is also reduced, which is represented by the following Expression 2:

$$\Delta_{therm} = KuV/k_BT = MsHkV/2k_BT. \qquad \text{[Expression 2]}$$

In the MRAM, the thermal stability of data is a very important characteristic that directly affects the performance. Therefore, it is not preferable that the thermal stability be sacrificed by a reduction of the volume V or the anisotropic magnetic field Hk in order to reduce the writing current. In order to put the MRAM to practical use, a thermal stability $\Delta_{therm}$ of about 40 is needed, and the switching current density Jc under the conditions satisfying the thermal stability is about $2 \times 10^6$ A/cm$^2$ to $4 \times 10^6$ A/cm$^2$, which is a large value.

In order to achieve a high-capacity (gigabit-class) MRAM, it is necessary to reduce the switching current Jc to $5 \times 10^5$ A/cm$^2$ or less. That is, it is necessary to reduce the switching current to a quarter or less.

The invention has been made in view of the above-mentioned problems and an object of the invention is to provide a magnetic memory element capable of maintaining high thermal stability (retention characteristics) while reducing a writing current and a nonvolatile semiconductor storage device with high reliability and low power consumption.

Means for Solving Problem

The inventors examined the above-mentioned problems on the basis of the principle of the operation of the magnetic memory element (MRAM element) of a current magnetization reversal (STT) method type and achieved the following magnetic memory element and nonvolatile storage device.

That is, a first magnetic memory element according to the invention includes: a magnetic tunnel junction portion having a first magnetic body including a perpendicular magnetization film, an insulating layer, and a second magnetic body serving as a storage layer including a perpendicular magnetization film which are sequentially stacked; a first electrode that is provided on the side of the first magnetic body; a second electrode that is provided on the side of the second magnetic body; and a thermal expansion layer that is inserted into the magnetic tunnel junction portion. A current flows to the magnetic tunnel junction portion to change a magnetization direction of the second magnetic body relative to the first magnetic body, thereby regulating the magnitude of a resistance value of the insulating layer. The second magnetic body is deformed in a direction in which the cross section thereof increases by the thermal expansion of the thermal expansion layer due to the flow of the current, thereby reducing a switching current threshold value required to change the magnetization direction.

According to the above-mentioned structure, the magnetic anisotropic energy, which is one of the elements for thermal stability, is dynamically changed during recording and during the period for which recording is not performed. According to the structure in which thermal stability is reduced during recording and thermal stability is improved during the period for which recording is not performed, it is possible to achieve both high data (magnetization) retention characteristics and a small writing current.

The second magnetic body is strained in a direction in which the cross-sectional area thereof increases in one cross section that is parallel to the interface between the second magnetic body and the insulating layer. Therefore, it is possible to effectively reduce the magnetic anisotropic energy (Ku) in the perpendicular direction during recording, thereby reducing the current required for writing.

The thermal expansion layer may be made of a material with a linear thermal expansion coefficient that is more than that of the second magnetic body in a temperature range, for example, from a room temperature to 200° C. The thermal expansion layer may be inserted between the second magnetic body and the second electrode.

According to this structure, it is possible to effectively generate thermal stress in the second magnetic body with Joule heat caused by a writing current during recording and reduce the magnetic anisotropic energy of the second magnetic body. In this way, it is possible to reduce the current required for writing.

The magnetic memory element may further include an expansion and contraction layer that is provided so as to come into contact with at least a side surface of the thermal expansion layer and accelerates the expansion of the thermal expansion layer. According to this structure, it is possible to easily expand the thermal expansion layer. Therefore, it is possible to further reduce the writing current.

The expansion and contraction layer may be formed so as to come into contact with a side surface of the second magnetic body. In this case, the product of a coefficient of thermal expansion and a Young's modulus of the expansion and contraction layer may be less than that of the second magnetic body. According to this structure, it is possible to prevent the expansion and contraction layer from restricting the strain deformation of the second magnetic body.

The thermal expansion layer may be made of a shape-memory alloy. According to this structure, large stress occurs in the second magnetic body due to large strain deformation of the shape-memory alloy, which makes it possible to effectively reduce the writing current.

A second magnetic memory element according to the invention includes: a magnetic tunnel junction portion having a first magnetic body including an in-plane magnetization film, an insulating layer, and a second magnetic body serving as a storage layer including an in-plane magnetization film which are sequentially stacked; a first electrode that is provided on the side of the first magnetic body; a second electrode that is provided on the side of the second magnetic body; and a thermal contraction layer that is inserted into the magnetic tunnel junction portion. A current flows to the magnetic tunnel junction portion to change a magnetization direction of the second magnetic body relative to the first magnetic body, thereby regulating the magnitude of a resistance value of the insulating layer. The second magnetic body is deformed in a direction in which the cross section thereof is reduced by the thermal contraction of the thermal contraction layer due to the flow of the current, thereby reducing a switching current threshold value required to change the magnetization direction.

According to this structure, similarly to the first magnetic memory element, it is possible to change the magnetic anisotropic energy and reduce the current required for writing.

The second magnetic body is strained in a direction in which the cross-sectional area thereof is reduced in one cross section that is parallel to the interface between the second magnetic body and the insulating layer. Therefore, according to this structure, it is possible to increase the magnetic anisotropic energy in the perpendicular direction in the in-plane magnetization film during recording and relatively reduce the magnetic anisotropic energy in the in-plane direction. As a result, it is possible to reduce the current required for writing.

The thermal contraction layer may be made of a material with a linear thermal expansion coefficient that is less than that of the second magnetic body in a temperature range, for example, from a room temperature to 200° C. The thermal contraction layer may be inserted between the second magnetic body and the second electrode.

According to this structure, it is possible to effectively generate thermal stress in the second magnetic body with Joule heat caused by a writing current during recording and increase the magnetic anisotropic energy in the perpendicular direction. In this way, it is possible to reduce the current required for writing.

As a preferred embodiment, the magnetic memory element may further include an expansion and contraction layer that is provided so as to come into contact with at least a side surface of the thermal contraction layer and accelerates the contraction of the thermal contraction layer. According to this structure, it is possible to easily contract the thermal contraction layer. Therefore, it is possible to further reduce the writing current.

The expansion and contraction layer may be formed so as to come into contact with a side surface of the second magnetic body. In this case, the expansion and contraction layer may have a Young's modulus less than that of the second magnetic body and have a coefficient of thermal expansion more than that of the second magnetic body. According to this structure, it is possible to prevent the expansion and contraction layer from restricting the strain deformation of the second magnetic body.

The thermal contraction layer may be made of a shape-memory alloy. According to this structure, large stress occurs in the second magnetic body due to large strain deformation of the shape-memory alloy, which makes it possible to effectively reduce the writing current.

A nonvolatile storage device according to the invention includes: the above-mentioned magnetic memory element; a switching element or a rectifying element that is connected in series to the magnetic memory element; an information rewriting unit that supplies a writing current to the magnetic memory element to perform writing and removal; and a reading unit that reads stored information from the amount of current flowing through the magnetic memory element.

According to the nonvolatile storage device, it is possible to reduce the current required for writing without deteriorating the thermal stability of data in each magnetic memory element. Therefore, it is possible to integrate the nonvolatile storage device having high reliability and low power consumption on a substrate with high density. As a result, it is possible to provide a high-performance nonvolatile storage device at a low cost.

ADVANTAGES OF THE INVENTION

According to the magnetic memory element and the storage device of the invention, the internal stress of a magnetic body serving as a storage layer is changed to reduce the magnetic anisotropic energy during writing. As a result, the current required for writing is reduced. During the period for which writing is not performed, it is possible to hold data (magnetization) with high thermal stability of the material forming the magnetic memory element. That is, according to the invention, it is possible to achieve both a small writing current and a long retention period of data.

BEST MODE FOR CARRYING OUT THE INVENTION

Hereinafter, a magnetic memory element, a method of manufacturing the same, and a storage device according to exemplary embodiments of the invention will be described with reference to the accompanying drawings.

First Embodiment

Figure 1:
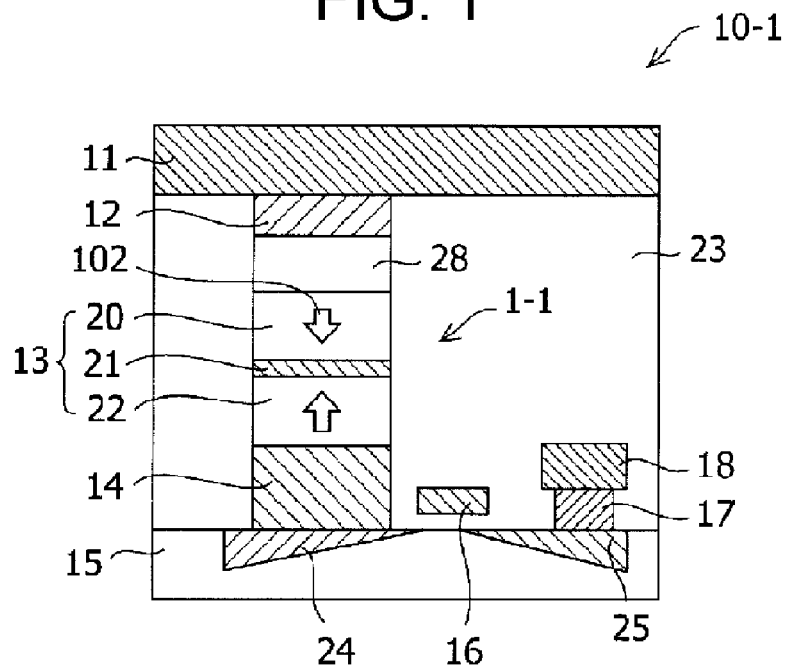
FIG. 1 is a cross-sectional view illustrating the structure of a magnetic memory element according to a first embodiment of the invention.
Figure 2:
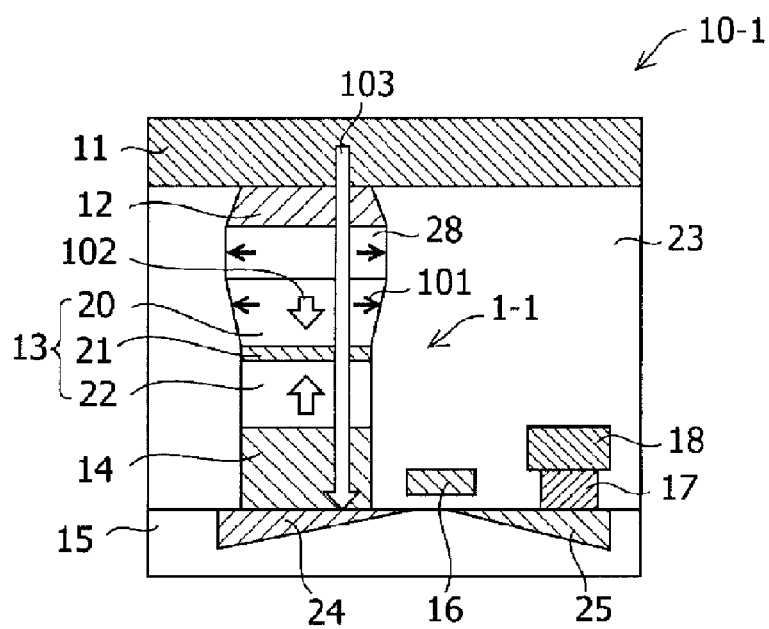
FIG. 2 is a cross-sectional view illustrating the operation of the magnetic memory element according to the first embodiment.
Figure 12:
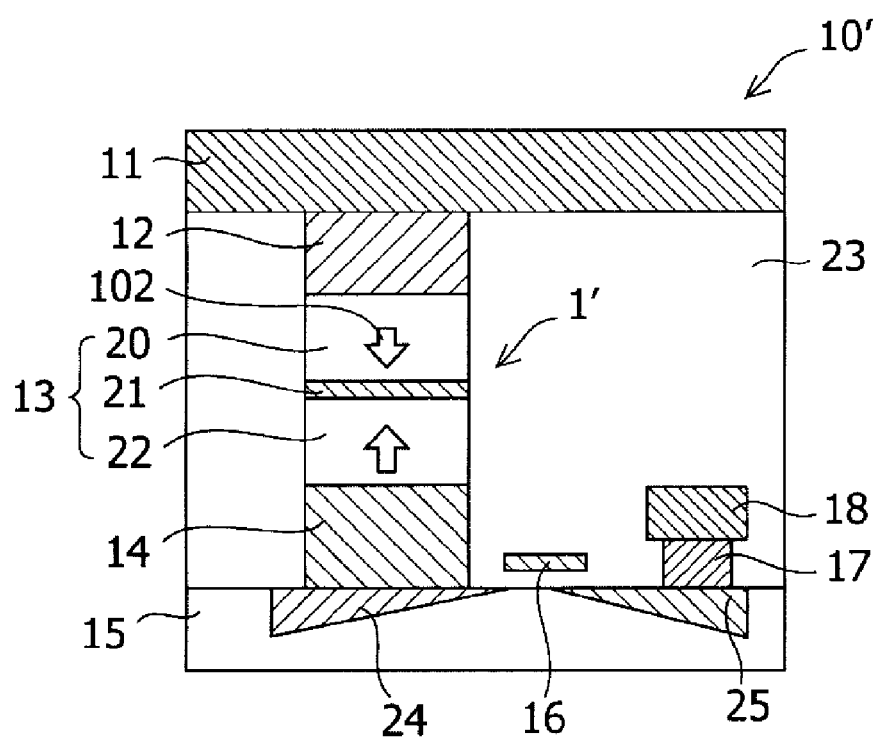
FIG. 12 is a cross-sectional view illustrating an example of the structure of a magnetic memory element according to the related art.
Figures 13A, 13B:
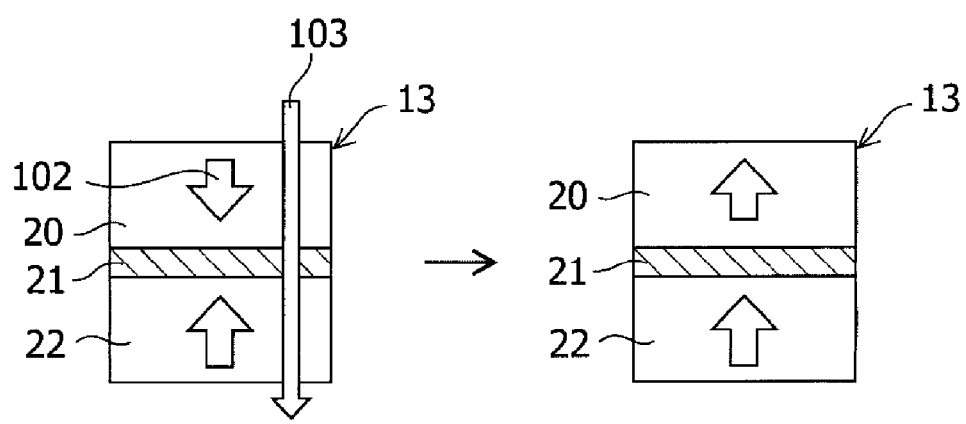
FIG. 13 is a diagram illustrating the principle of the operation of the magnetic memory element according to the related art.

FIG. 1 is an enlarged cross-sectional view illustrating a portion of a storage device 10-1 including a magnetic memory element 1-1. In FIGS. 1 and 2, the same components as those shown in FIG. 12 are denoted by the same reference numerals and a description thereof will not be repeated. The structure of the magnetic memory element 1-1 according to this embodiment is different from that of the magnetic memory element 1' according to the related art shown in FIG. 12 in that a thermal expansion layer 28 is inserted between a storage layer 20 and an upper electrode 12. The principle of the reading and writing operations of the magnetic memory element 1-1 is the same as that of the reading and writing operations of the magnetic memory element 1' according to the related art and thus a description thereof will not be repeated.

The magnetic memory element 1-1 including the thermal expansion layer 28 can reduce a writing current for the following reason. That is, the writing (STT) current of the magnetic memory element is large ($>10^6$ A/cm$^2$). Therefore, Joule heat generated by this current increases the temperature in the vicinity of an insulating layer 21 by about 80 K to 150 K (see Non-patent Literature 3). FIG. 2 is an enlarged cross-sectional view illustrating the magnetic memory element 1-1 during a writing operation, which is the same as FIG. 1. In FIG. 2, an arrow 101 indicates the direction of stress, an arrow 102 indicates the direction of magnetization, and an arrow 103 indicates the direction of a writing current.

When an increase in the temperature due to the writing current is transferred to the thermal expansion layer 28, the thermal expansion layer 28 is thermally expanded, as shown in FIG. 2. When the thermal expansion layer 28 is thermally expanded, the storage layer 20 is expanded and stress occurs in the storage layer 20. Magnetic anisotropic energy is reduced by the stress, which will be described below. Therefore, it is possible to reduce the current required for writing.

Figure 3:
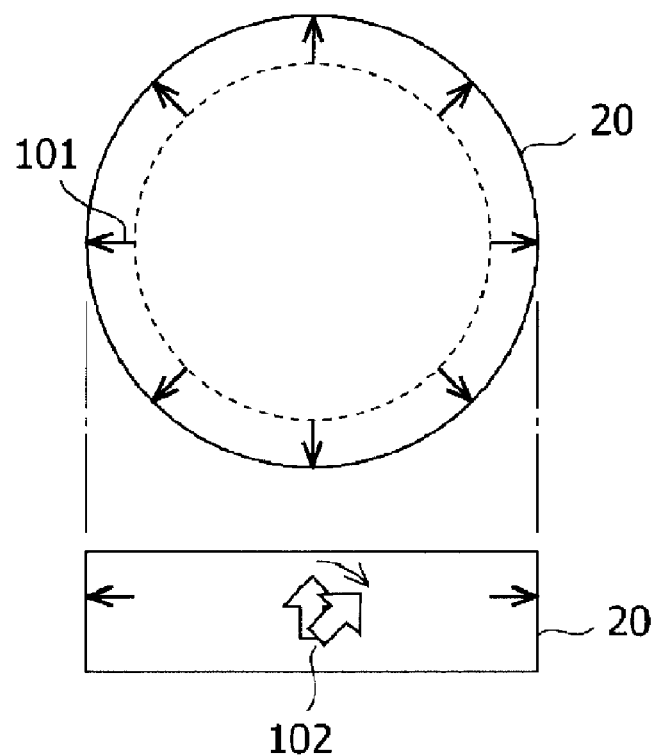
FIG. 3 is a conceptual diagram illustrating an aspect in which the stability of the magnetization of a storage layer is reduced due to stress.

The stress will be described with reference to FIG. 3. In FIG. 3, a cross-sectional view of a portion of the storage layer 20 (a cross-sectional view taken in parallel to the interface with the insulating layer 21) is shown on the upper side and a front view of the storage layer 20 is shown on the lower side. In addition, in FIG. 3, the shape of the storage layer 20 before it is expanded by the thermal expansion layer 28 is represented by a dashed line and the shape of the storage layer 20 after it is expanded is represented by a solid line. As such, the storage layer 20 is strained and deformed by a tensile action caused by the thermal expansion of the thermal expansion layer 28 in a direction in which the cross-sectional area thereof increases. Tensile stress occurs in the strain-deformed storage layer 20. Therefore, magnetoelastic energy ($E_{mel}$=3/2$\lambda\sigma$: $\lambda$ is a magnetostriction constant and $\sigma$ is stress), which is a portion of the magnetic anisotropic energy, is changed. Since the change in the magnetoelastic energy reduces the magnetic anisotropic energy in the perpendicular direction, the magnetization direction is slightly inclined with respect to the perpendicular direction (the original direction). As a result, according to the first embodiment, it is possible to reduce a switching current threshold value Jc required for magnetization reversal. In FIG. 3, the storage layer 20 is strained so as to be symmetric with respect to the center point. The symmetric strain is not particularly needed. The strain may occur such that the cross-sectional area after strain is more than the original cross-sectional area.

As described above, the magnetic memory element 1-1 according to this embodiment is configured so as to reduce the writing current on the basis of a reduction in magnetic anisotropic energy due to the strain deformation of the storage layer 20.

For example, the storage layer 20 (second magnetic body) is preferably made of the following material: a magnetic-nonmagnetic stack material with high thermal stability that is obtained by stacking a ferromagnetic body with perpendicular magnetic anisotropy, such as TbCo, TbFeCo, GdCo, GdFeCo, FePt, CoPt, or CoCrPt—SiO2, a ferromagnetic body with perpendicular magnetic anisotropy, such as [Co/Pd]n, and a non-magnetic body and magnetically connecting the ferromagnetic bodies; and a material obtained by stacking a spin polarization material (which will be described below) on these materials. In particular, a rare earth-transition metal alloy, such as TbCo, GdCo, TbFeCo, or GdFeCo, is preferable since it has a large magnetostriction constant and a small coefficient of linear expansion (a coefficient of thermal expansion) and is feasible to reduce the writing current.

The above-mentioned spin polarization material indicates the following two kinds of alloys:

(1) A material with high spin polarizability (for example, half metal, such as a Heusler alloy); and (2) A magnetic body in which a spin is completely polarized with respect to Δ1 band, such as Fe, FeCo, or FeCoB.

The reason why (2) is included in the spin polarization material is that, when these magnetic bodies (for example, Fe, FeCo, and FeCoB) are combined with an insulating layer having fourfold symmetry in the stack direction, such as a MgO layer, to form a spin tunnel junction, the insulating layer selectively transmits Δ1 band conductive electrons, which makes it possible to improve effective spin polarizability. In the structure using, for example, FeCo, it has been theoretically and experimentally proved that a magnetic resistance ratio of about 1000% is obtained by optimizing conditions.

The thermal expansion layer 28 is preferably made of a material with a linear expansion coefficient (a coefficient of thermal expansion) more than that of the storage layer 20 in the temperature range from room temperature to 200° C. Specifically, a metal film, such as an Al film (about 23 ppm/K), an Ag film (20 ppm/K), a Ni film (18 ppm/K), a Cu film (17 ppm/K), a Mg film (about 28 ppm/K), or a Si film (about 24 ppm/K), an alloy film including them, or an alloy film made of a stainless material, such as Ni—Cr—Mn or Ni—Cr (about 18 ppm/K), is preferable as the thermal expansion layer 28. A pinned layer 22 may be made of, for example, TbFeCo, which is the same material as that used in the related art (Details are disclosed in Patent Literature 1 and Non-patent Literature 2).

Figure 4A:
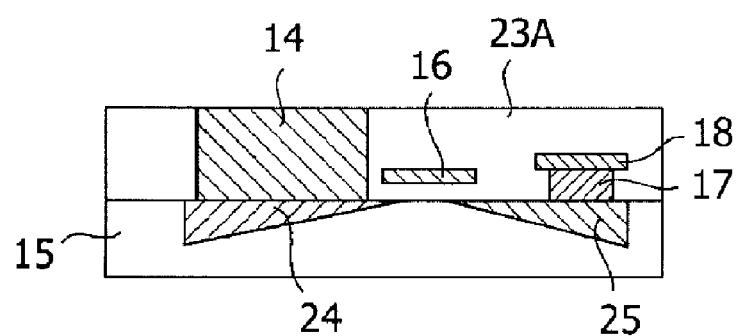
FIG. 4a is a cross-sectional view illustrating a first manufacturing process of the magnetic memory element according to the first embodiment.

Next, a method of manufacturing the magnetic memory element 1-1 will be described with reference to FIG. 1 and FIGS. 4a to 4g. First, as shown in FIG. 4a, a drain region 24, a source region 25, a gate line 16, a contact hole 17, a word line 18, a lower electrode 14, and an insulating film 23A are formed on a Si wafer 15 by a general CMOS process.

Figure 4B:
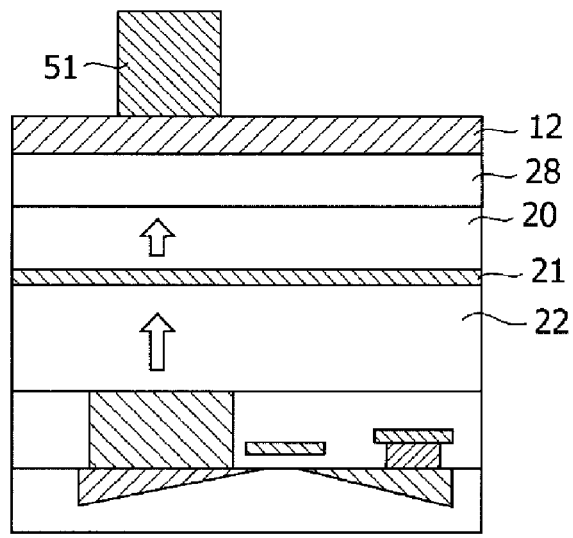
FIG. 4b is a cross-sectional view illustrating a second manufacturing process of the magnetic memory element according to the first embodiment.

Then, as shown in FIG. 4b, the pinned layer 22 (TbFeCo: 5 nm and FeCo: 1 nm), the insulating layer 21 (MgO: 1.0 nm), the storage layer 20 (FeCo: 1 nm and GdCo: 2 nm), a thermal expansion layer 28 (Al: 5 nm), and the upper electrode 12 (Ta: 5 nm/Ru: 10 nm/Ta: 5 nm) are formed by a magnetron sputtering method. Then, a resist 51 is exposed and developed in a circular shape with a diameter of about 100 nm by photolithography.

Figure 4C:
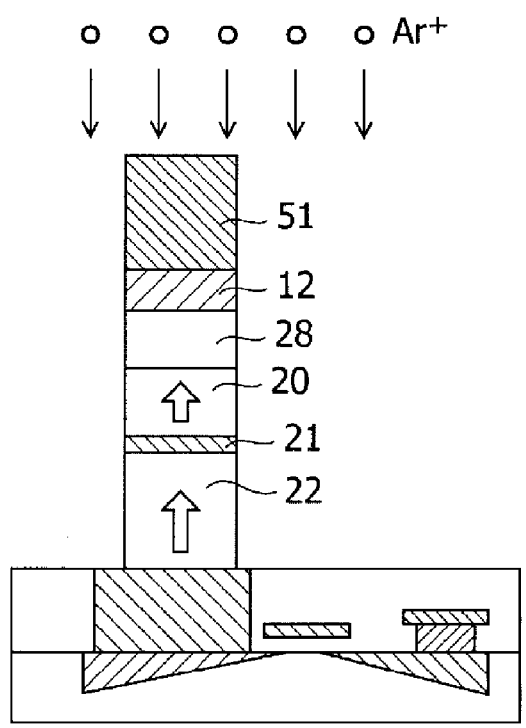
FIG. 4c is a cross-sectional view illustrating a third manufacturing process of the magnetic memory element according to the first embodiment.
Figure 4D:
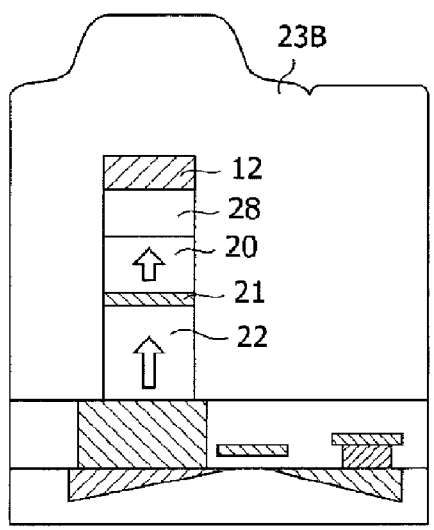
FIG. 4d is a cross-sectional view illustrating a fourth manufacturing process of the magnetic memory element according to the first embodiment.
Figure 4E:
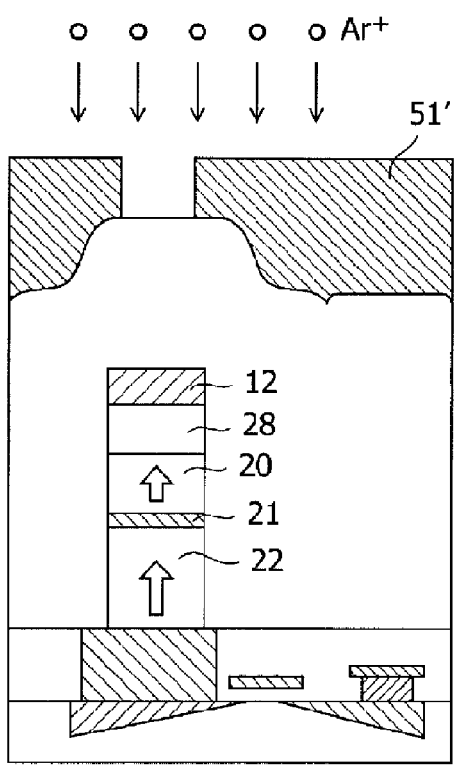
FIG. 4e is a cross-sectional view illustrating a fifth manufacturing process of the magnetic memory element according to the first embodiment.
Figure 4F:
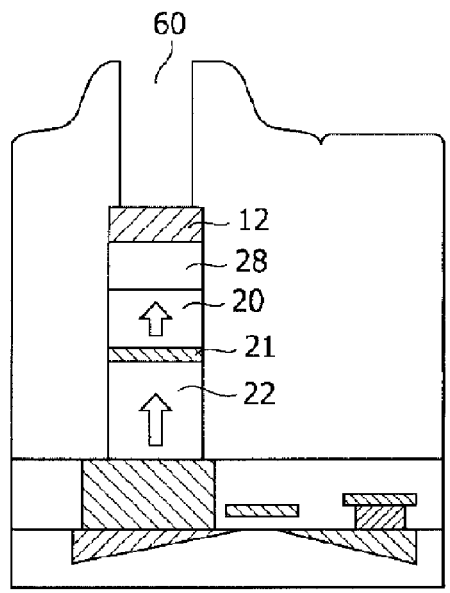
FIG. 4f is a cross-sectional view illustrating a sixth manufacturing process of the magnetic memory element according to the first embodiment.
Figure 4G:
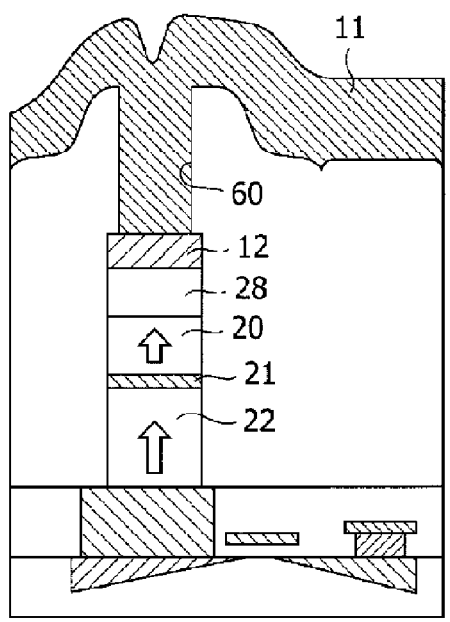
FIG. 4g is a cross-sectional view illustrating a seventh manufacturing process of the magnetic memory element according to the first embodiment.

Then, as shown in FIG. 4c, a sputtered film other than the resist 51 is removed by ion etching. Then, the resist 51 is removed by, for example, a solvent or ashing process. Then, as shown in FIG. 4d, an interlayer insulating film 23B (SiO$_2$: 60 nm) is formed. Then, as shown in FIGS. 4e and 4f, a contact hole 60 is formed at an upper part of the upper electrode 12 by photolithography. Then, as shown in FIG. 4g, a bit line 11 is formed. The magnetic memory element 1-1 can be manufactured in this way. In FIG. 4e, reference numeral 51' indicates a resist.

Next, the effect of the magnetic memory element 1-1 according to this embodiment will be described. In this embodiment, it is assumed that the storage layer 20 is made of TbCo and the thermal expansion layer 28 is made of Al. When the temperature in the vicinity of the insulating layer 21 is increased by about 50 K due to the writing current and the coefficient of thermal expansion (coefficient of linear thermal expansion) of TbCo is 8 ppm/K (a typical value of an amorphous iron alloy), the coefficient of thermal expansion of Al is 28 ppm/K. Therefore, a stress of about 100 MPa occurs in TbCo due to the difference between the coefficients of thermal expansion (in this case, the Young's modulus of TbCo is 100 GPa). A variation in magnetoelastic energy due to the stress is about $4 \times 10^5$ J/m ($=4 \times 10^6$ erg/cc) when the magnetostriction constant of TbCo is 200 ppm. Since the magnetic anisotropic energy of TbCo is about $2 \times 10^5$ J/m ($2 \times 10^6$ erg/cc), the magnetic anisotropic energy in the perpendicular direction is removed by the variation in magnetoelastic energy. As a result, a switching threshold value current Jc calculated by Expression 1 becomes 0.

Figure 5:
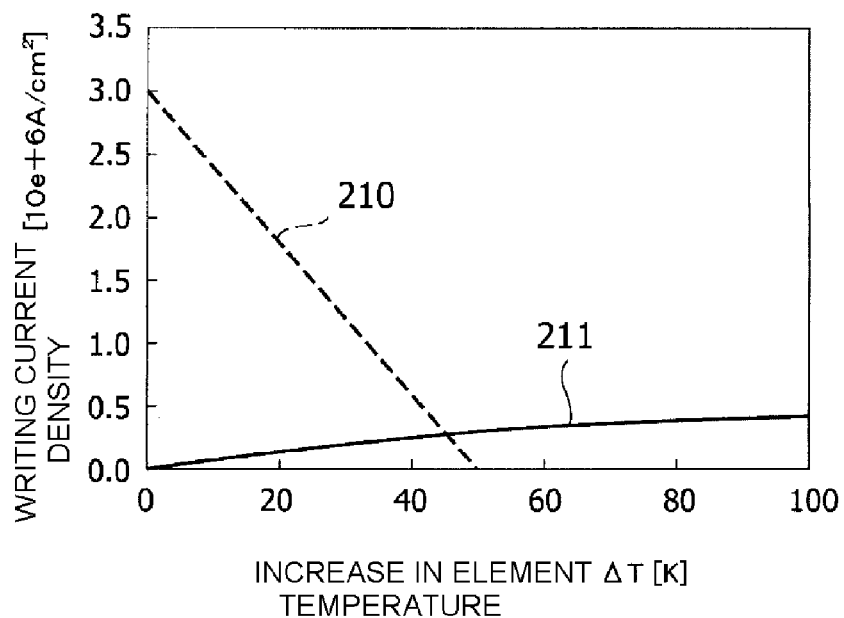
FIG. 5 is a graph illustrating the relationship between the current and the element temperature of the magnetic memory element according to the invention.

However, since a current is needed in order to increase the element temperature, it is difficult to unlimitedly reduce the writing current. In FIG. 5, a dashed line 210 indicates the relationship between the temperature and the switching threshold value current Jc (calculated value) of the magnetic memory element 1-1 and a solid line 211 indicates the relationship between an increase in the temperature of the magnetic memory element 1-1 and the current (calculated value) required to increase the temperature. In FIG. 5, the intersection between the lines 210 and 211 is a minimum writing current of about $3 \times 10^5$ A/cm$^2$. This satisfies the following conditions of the writing current: Jc<$5 \times 10^5$ A/cm$^2$.

During the period for which writing is not performed, the thermal stress does not occur, and the magnetic anisotropic energy of the material forming the storage layer 20 is maintained. Thermal stability $\Delta_{therm}$ at that time is equal to or more than 100 (element size: Φ100 nm). As described above, according to the magnetic memory element 1-1 of the invention, it is possible to satisfy the conditions (writing current conditions and thermal stability conditions) of the above-mentioned high-capacity MRAM, which shows that a gigabit-class MRAM can be achieved.

Second Embodiment

Figure 6:
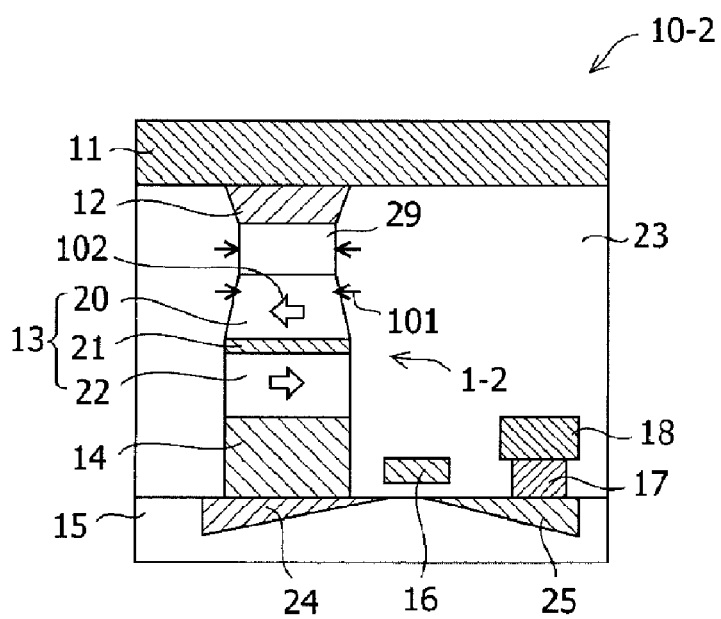
FIG. 6 is a cross-sectional view illustrating the structure of a magnetic memory element according to a second embodiment of the invention.

FIG. 6 is an enlarged cross-sectional view illustrating a portion of a storage device 10-2 including a magnetic memory element 1-2 according to a second embodiment. In FIG. 6, the same components as those shown in FIG. 1 are denoted by the same reference numerals and a description thereof will not be repeated.

The magnetic memory element 1-2 according to this embodiment uses in-plane magnetization films that are magnetized in the left-right direction in FIG. 6 as the storage layer 20 (second magnetic body) and the pinned layer 22 (first magnetic body). In addition, the magnetic memory element 1-2 includes a thermal contraction layer 29 instead of the thermal expansion layer 28 shown in FIG. 1.

As described above, the magnetic memory element 1-1 according to the first embodiment shown in FIG. 1 is strained by the thermal expansion layer 28 in the direction in which the cross-sectional area (a cross section parallel to the interface between the storage layer 20 and the insulating layer 21) thereof increases (see FIG. 2). In contrast, as shown in FIG. 6, the magnetic memory element 1-2 according to this embodiment is strained by the thermal contraction layer 29 in the direction in which the cross-sectional area (the area of a cross section parallel to the interface between the storage layer 20 and the insulating layer 22) thereof is reduced.

First, the principle of the operation of the magnetic memory element 1-2 according to this embodiment will be described. In the magnetic memory element 1-2, similarly to the magnetic memory element 1-1 according to the first embodiment, during a writing operation, a writing current flows to the insulating layer 22. Since the writing current causes the generation of Joule heat, the temperature in the vicinity of the insulating layer 21 is increased by about 100 K, which causes the thermal expansion of the storage layer 20. In this case, since the thermal expansion coefficient of the thermal contraction layer (heat shrinkage assist layer) 29 is less than that of the storage layer 20, the storage layer 20 is drawn by the thermal contraction layer 29 (see left and right small arrows). As a result, stress (compression stress) occurs in the storage layer 20 in a direction in which the area of the film is reduced. When the compression stress occurs, the magnetoelastic energy ($E_{mel}=\lambda\sigma$: $\lambda$ is a magnetostriction constant and $\sigma$ is stress) of the storage layer 20 is changed, which reduces magnetic anisotropic energy in the perpendicular direction. As a result, according to the magnetic memory element 1-2 of this embodiment, it is possible to reduce the switching current threshold value required for magnetization reversal.

In this embodiment, the storage layer 20 (second magnetic body) is preferably a single-layer film made of the above-mentioned spin polarization material or is preferably made of the following material: a ferromagnetic material, permalloy or CoCr; a ferromagnetic-nonmagnetic stack material, such as FeCoB/Ru/CoFe, with high thermal stability that is obtained by stacking a ferromagnetic body with perpendicular magnetic anisotropy and a non-magnetic body and magnetically connecting the ferromagnetic bodies; or a material obtained by stacking the ferromagnetic-nonmagnetic stack material and a spin polarization material. In particular, FeCo or FeCoB is preferable since it is effective in a MgO-MTJ structure.

The thermal contraction layer 29 is preferably made of a metal material with a coefficient of linear expansion less than that of the storage layer 20 (second magnetic body) in the temperature range from room temperature to 200° C. For example, when the second magnetic body is made of FeCo, it has a coefficient of linear expansion of about 14 ppm/K. Therefore, the thermal contraction layer is preferably a metal film, such as a Cr film (about 6 ppm/K), a Ge film (about 6 ppm/K), a Zr film (about 5.4 ppm/K), a W film (about 4.5 ppm/K), a Ta film (about 6.3 ppm/K), a Ti film (about 9 ppm/K), a Pt film (about 9 ppm/K), a V film (8.4 ppm/K), a Mo film (about 5 ppm/K), a La film (about 5 ppm/K), a Gd film (about 4 ppm/K), a Ta film (about 6.5 ppm/K), or a W film (about 5 ppm/K), an alloy film thereof, or an Invar alloy (for example, FeNi, FeB, FeP, FeGd, CoB, FeAl, or CrAl) film having an Invar effect.

Next, the effect of the magnetic memory element 1-2 according to this embodiment will be described. In this embodiment, it is assumed that the coefficient of thermal expansion of the storage layer 20 is about 14 ppm/K (when FeCo is used) and the coefficient of thermal expansion of the thermal contraction layer 29 is 4 ppm/K (when Gd is used). When the temperature in the vicinity of the insulating layer 21 is increased by about 50 K due to the writing current during a writing operation, a stress of about 100 MPa occurs in the storage layer 20 due to the difference between the thermal expansion coefficients of the storage layer 20 and the thermal contraction layer 29 (the Young's modulus of FeCo forming the storage layer 20 is about 200 GPa). The stress reduces the magnetic anisotropic energy in the in-plane direction. Therefore, according to the magnetic memory element 1-2 according to the second embodiment, similarly to the magnetic memory element 1-1 according to the first embodiment, it is possible to reduce a switching threshold value current Jc required for writing.

During the period for which writing is not performed, the thermal stress does not occur. Therefore, similarly to the first embodiment, high thermal stability is maintained. In this way, according to the magnetic memory element 1-2 of this embodiment, when the in-plane magnetization films are used as the storage layer 20 and the pinned layer 22, it is possible to satisfy the conditions (writing current conditions and thermal stability conditions) of a high-capacity MRAM, that is, it is possible to achieve a gigabit-class MRAM.

Third Embodiment

Figure 7:
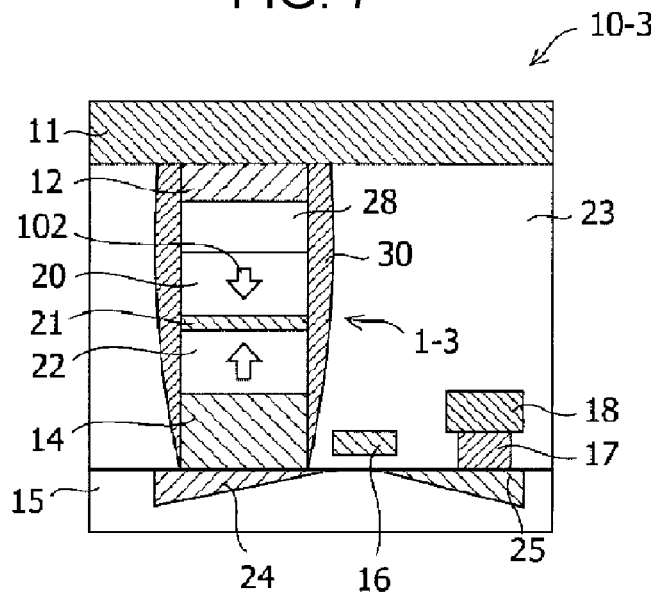
FIG. 7 is a cross-sectional view illustrating the structure of a magnetic memory element according to a third embodiment of the invention.

FIG. 7 is an enlarged cross-sectional view illustrating a portion of a storage device 10-3 including a magnetic memory element 1-3 according to a third embodiment. In FIG. 7, the same components as those shown in FIG. 1 are denoted by the same reference numerals and a description thereof will not be repeated.

The structure of the magnetic memory element 1-3 according to this embodiment is different from that of the magnetic memory element 1-1 according to the first embodiment shown in FIG. 1 in that an expansion and contraction layer 30 is provided between the interlayer insulating film 23 and the thermal expansion layer 28. However, in this embodiment, the expansion and contraction layer 30 is also provided between the interlayer insulating film 23 and the storage layer 20.

In the magnetic memory element 1-1 according to the first embodiment, the thermal expansion layer 28 is thermally expanded by Joule heat generated due to a writing current. At that time, the thermal expansion of the thermal expansion layer 28 is slightly restricted by the interlayer insulating film 23 provided in the vicinity of the thermal expansion layer 28. Therefore, in this embodiment, the expansion and contraction layer 30 made of, for example, a porous insulating material with a low elastic modulus is inserted between the thermal expansion layer 28 and the interlayer insulating film 23. According to this structure, the thermal expansion layer 28 is likely to be thermally expanded. Therefore, it is possible to effectively reduce the magnetic anisotropic energy of the storage layer 20.

Next, a method of manufacturing the magnetic memory element 1-3 according to the third embodiment will be described. When the magnetic memory element 1-3 is manufactured, the process (a CMOS process to an ion etching process) shown in FIGS. 4a to 4c are performed and then the process shown in FIGS. 8a to 8d are performed. The process shown in FIGS. 4a to 4c has been described above. Next, the process shown in FIGS. 8a to 8d will be described.

Figure 8A:
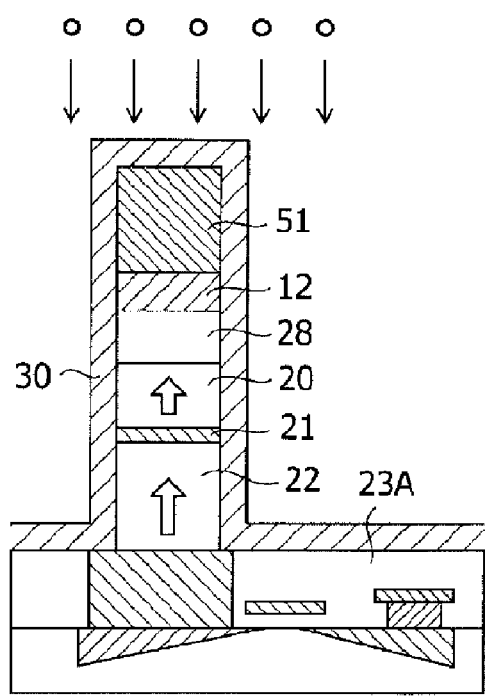
FIG. 8a is a cross-sectional view illustrating a first manufacturing process of the magnetic memory element according to the third embodiment.
Figure 8B:
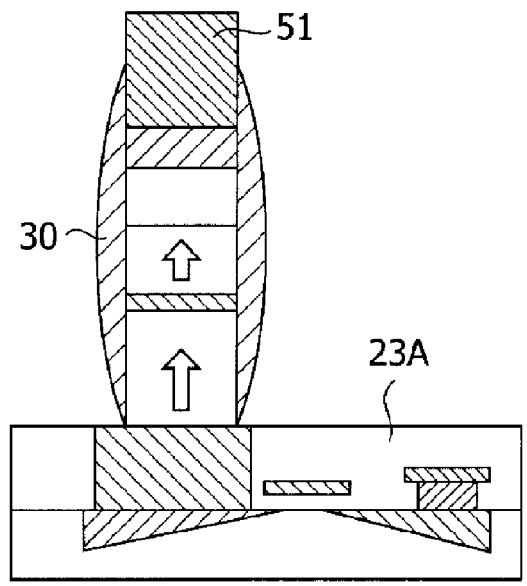
FIG. 8b is a cross-sectional view illustrating a second manufacturing process of the magnetic memory element according to the third embodiment.

After the ion etching process shown in FIG. 4c, the resist 51 remains, and the expansion and contraction layer 30 (porous SiOC: to 10 nm) is formed by a plasma CVD method (FIG. 8a). Then, a portion of the expansion and contraction layer 30 is removed by ECR plasma etching with high directivity (FIG. 8b). In this case, since ECR plasma has high directivity, a film attached to a side wall portion of, for example, the storage layer 20 is less likely to be removed and a porous SiOC layer deposited on the plane of the film is preferentially removed. As a result, the porous SiOC layer remains only on the side wall portion. In addition, although not shown in the drawings, a little portion of the expansion and contraction layer 30 that does not cause an operational problem is likely to remain on the resist 51 or the insulating film 23A according to an etching apparatus.

Figure 8C:
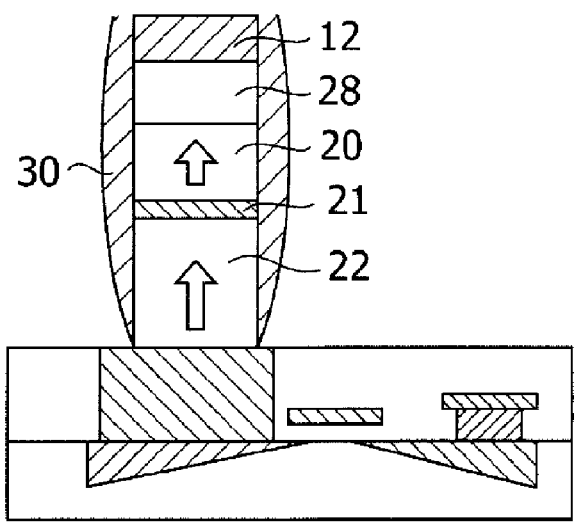
FIG. 8c is a cross-sectional view illustrating a third manufacturing process of the magnetic memory element according to the third embodiment.
Figure 8D:
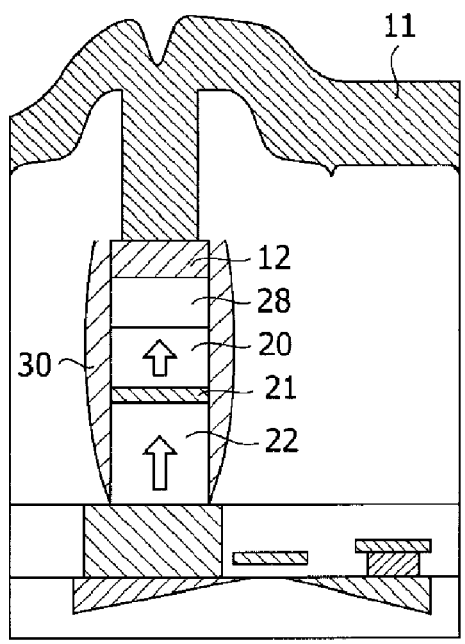
FIG. 8d is a cross-sectional view illustrating a fourth manufacturing process of the magnetic memory element according to the third embodiment.

After the process of forming the expansion and contraction layer 30, the resist 51 is rinsed off by a solvent, such as acetone or NMP (FIG. 8c). At that time, when the resist 51 is insufficiently removed, supercritical $CO_2$ cleaning may be used. Then, when the same process as that in the first embodiment (FIGS. 4d to 4g) is performed, it is possible to manufacture the magnetic memory element 1-3 according to this embodiment (FIG. 8d).

The expansion and contraction layer 30 according to this embodiment is an electric insulator and the product of the Young's modulus E and the linear expansion coefficient $\alpha$ of the expansion and contraction layer 30 is less than that of the storage layer 20. For example, SiOC is given as the material.

SiOC has a coefficient of thermal expansion of about 20 ppm/K, which is two times more than the typical value, 8 ppm/K, of the coefficient of thermal expansion of TbCo forming the storage layer 20. In this case, the Young's modulus E of the expansion and contraction layer 30 needs to be less than ½. However, since the Young's modulus of SiOC can be adjusted in the range of 1 GPa to 20 GPa depending on film formation conditions (PE-CVD), SiOC is preferable as a material satisfying the conditions of the Young's modulus E. In addition, an organic insulating material (3 GPa to 18 GPa), such as P-MSQ (porous methylsilses quioxane), is preferable for the same reason as described above. Furthermore, for example, SiOF, DIPB (di-iso-propenyl-benzene), NCS (nanoclustering silica), HSQ (hydrogen silsesquioxane), BCB (benzocyclobutene), and PAE (polyarylether) are preferable.

Next, the effect of the magnetic memory element 1-3 according to the third embodiment will be described. SiOC has a coefficient $\alpha$ of linear thermal expansion of several ppm and a Young's modulus E of less than about 20 GPa. Therefore, the product $E \times \alpha$ of SiOC is significantly less than that of TbCo, which is the material forming the storage layer 20. Therefore, there is no concern that the thermal expansion of TbCo forming the storage layer 20 will be restricted. As a result, it is possible to effectively apply thermal stress to the storage layer 20 to induce a variation in the magnetic anisotropic energy.

It is considered that SiOC used as a material forming the expansion and contraction layer 30 is used as a material forming the interlayer insulating film 23. However, the interlayer insulating film 23 needs to have mechanical strength (a Young's modulus of 8 GPa or more) in terms of processes. When the expansion and contraction layer 30 is made of SiOC satisfying the conditions, there is a concern that the thermal expansion of the storage layer 20 will be restricted a little. Therefore, when the interlayer insulating film 23 is made of SiOC, it is preferable to adjust the Young's modulus (1 GPA to 20 GPa) of SiOC according to the film formation conditions (plasma power and gas pressure of PE-CVD) to make a difference (the former Young's modulus<the latter Young's modulus) between the Young's modulus of the expansion and contraction layer 30 and the Young's modulus of the interlayer insulating film 23 such that the writing current can be reduced without damaging the overall mechanical strength.

Similarly, it is considered that p-MSQ used as a material forming the expansion and contraction layer 30 is used as a material forming the interlayer insulating film 23. In this case, there is a concern that the same problems as those arising in SiOC will occur. p-MSQ is formed by SOD (Spin on dielectrics), and the Young's modulus of p-MSQ may be adjusted (3 GPa to 18 GPa) by adjusting the amount of volatile material in a solution, which is a raw material of p-MSQ. Therefore, when p-MSQ is used as a material forming the interlayer insulating film 23, similarly to SiOC, the Young's modulus of the expansion and contraction layer 30 and the Young's modulus of the interlayer insulating film 23 are appropriately set such that the writing current can be reduced without damaging the overall mechanical strength.

Fourth Embodiment

Next, a magnetic memory element according to a fourth embodiment of the invention will be described. Although not shown in the drawings, the magnetic memory element according to the fourth embodiment has a structure in which a thermal expansion layer made of a shape-memory alloy is provided instead of the thermal expansion layer 28 according to the first embodiment shown in FIG. 1. As the shape-memory alloy, a shape-memory alloy (for example, NiTiCu, NiTi, or CuZnAl) whose shape is changed by a maximum of about 1% when the shape-memory alloy is heated at a temperature of, for example, 100° C. to 200° C. is used.

In the first embodiment, a thermal stress of about 100 MPa is applied to the storage layer 20. When the storage layer 20 is made of a material with a large magnetostriction constant (>100 ppm), such as a rare earth-transition metal alloy, the thermal stress is sufficient to reduce the magnetic anisotropic energy. However, when the storage layer 20 is made of a material (an alloy including only transition metal), such as CoCrPt(—SiO$_2$) or FePt, with a magnetostriction constant that is one digit smaller than that of the above-mentioned material, the decreasing rate of the magnetic anisotropic energy is reduced even though the same stress as described above is applied. Therefore, in this embodiment, the shape-memory alloy is used to apply a stress that is about one digit more than that in the first embodiment to the storage layer 20. According to the magnetic memory element of the fourth embodiment, even when the storage layer 20 is made of a material, such as CoCrPt(—SiO$_2$) or FePt, with a magnetostriction constant that is one digit smaller than that of the above-mentioned material, it is possible to sufficiently reduce the magnetic anisotropic energy and thus obtain the effect of reducing the writing current.

Next, an example of a method of manufacturing the magnetic memory element according to this embodiment will be described. When the magnetic memory element according to this embodiment is manufactured, the process (process before magnetron sputtering) shown in FIG. 4a is performed. Then, as shown in FIG. 4b, the pinned layer 22 (TbFeCo: 5 nm and FeCo: 1 nm), the insulating layer 21 (MgO: 0.5 nm), and the storage layer 20 (FeCo: 1 nm and TbCo: 2 nm) are sequentially formed by a magnetron sputtering method.

Figure 9:
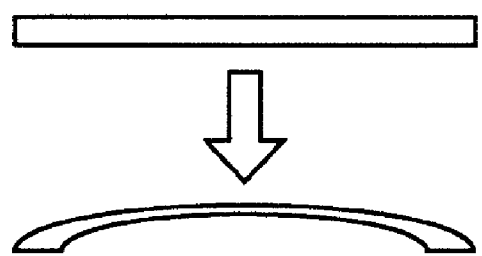
FIG. 9 is a conceptual diagram illustrating a method of manufacturing a magnetic memory element according to a fourth embodiment of the invention.

Then, as shown in FIG. 9, all of the elements on each substrate are deformed in a convex shape (curvature radius: about 2 m), and the substrate is heated at a temperature of about 300° C. In this state, NiTiCu is formed with a thickness of 5 nm as a thermal expansion layer (a thermal expansion layer replacing the thermal expansion layer 28 shown in FIG. 1 and FIG. 7) made of a shape-memory alloy by sputtering. Then, after the sputtering, the substrate is cooled to room temperature and then the upper electrode 12 (Ta: 5 nm/Ru: 1.0 nm/Ta: 5 nm) shown in FIG. 4b is stacked. Then, a resist 51 is exposed and developed in a circular shape with a diameter of about 100 nm by photolithography (or electron beam lithography). The subsequent process is completely the same as that in the method of manufacturing the magnetic memory element 1-1 (or 1-3) according to the first (or the third) embodiment and thus a description thereof will not be repeated.

In this embodiment, for example, NiTiCu, NiTi, or CuZnAl is preferable as the shape-memory alloy forming the thermal expansion layer. In particular, NiTiCu is most preferable since it is crystallized when the substrate is heated at a temperature of about 300° C. and has a small effect on the magnetic layer.

Next, the operation and effect of the magnetic memory element according to the fourth embodiment will be described. As described in the first embodiment, in the magnetic memory element according to the invention, the temperature of the storage layer 20 is increased by about 100 K due to Joule heat generated by the writing current. At that time, the temperature of the shape-memory alloy (thermal expansion layer), which is NiTiCu and is provided on the storage layer 20, is also increased by about 100 K, which induces a shape change. As a result, the storage layer 20 is drawn by the shape-memory alloy whose shape has been changed, and the cross-sectional area (a cross section parallel to the interface between the storage layer 20 and the thermal expansion layer) thereof increases. At that time, the maximum amount of strain of the storage layer 20 is about 1%. The amount of strain is one digit more than that of the storage layer 20 according to the first to third embodiments. Therefore, stress occurring in the storage layer 20 (for example, made of TbCo) due to the strain increases and reaches a maximum of about 1 GPa.

As such, according to the magnetic memory element of the fourth embodiment, it is possible to generate large stress in the storage layer 20. Therefore, even when TbCo, which is a material forming the storage layer 20, is replaced with, for example, a CoCrPt-based granular alloy, FePt, or CoPt, it is possible to generate a sufficient variation in magnetoelastic energy (to $10^5$ J/m). CoPt or CoCrPt—$SiO_2$ is more resistant to oxidation (deterioration over time) than a rare earth-fiber metal alloy, such as TbCo. Therefore, according to the magnetic memory element of the fourth embodiment, it is possible to achieve a nonvolatile storage device with high reliability and a long life span.

Fifth Embodiment

Next, a nonvolatile storage device according to a fifth embodiment of the invention that uses the magnetic memory element 1 (for example, the magnetic memory elements 1-1, 1-2, and 1-2) according to each of the above-described embodiments will be described with reference to FIGS. 10 and 11.

Figure 10:
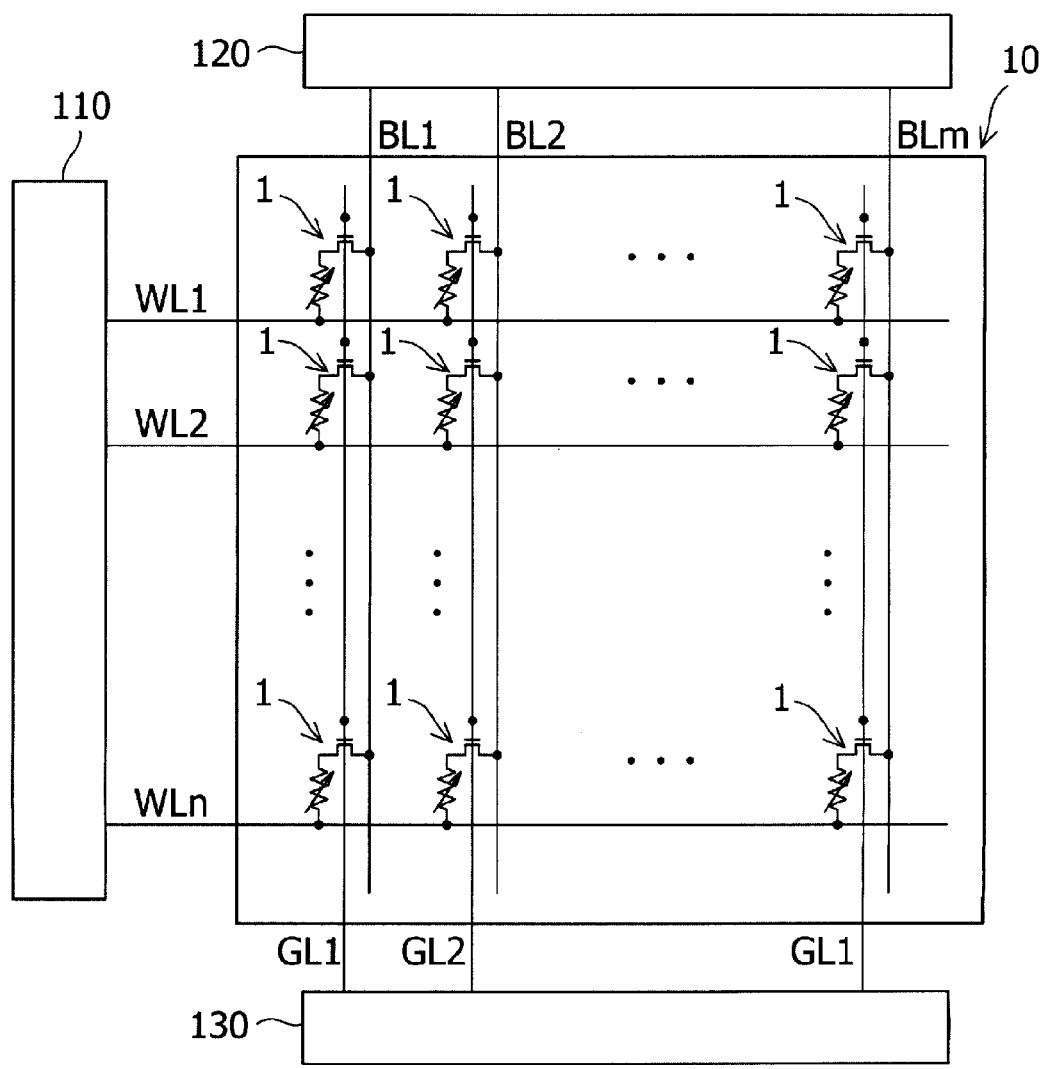
FIG. 10 is a block diagram illustrating the circuit structure of a cross-point type memory cell array of a nonvolatile storage device according to an example of the invention.
Figure 11:
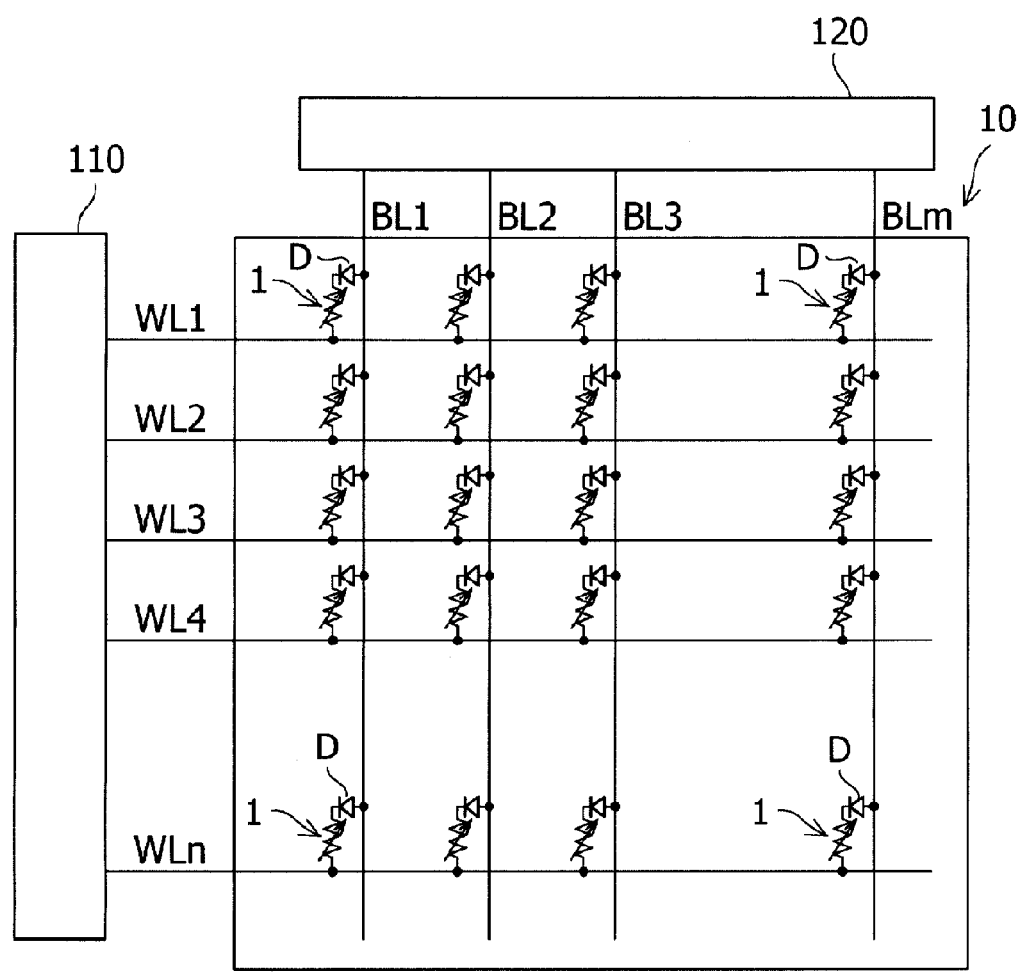
FIG. 11 is a block diagram illustrating the circuit structure of a cross-point type memory cell array of a nonvolatile storage device according to another example of the invention.

FIG. 10 is a block diagram illustrating a nonvolatile storage device 10 having a cross-point type memory cell array structure. In the nonvolatile storage device 10, each memory cell including the magnetic memory element 1 and a MOS-FET is driven through a word line WLi (i=1 to n), a bit line BLj (j=1 to m), and a gate line GLj (j=1 to l).

The MOS-FET is connected as a switch for selecting the magnetic memory element 1 in series to the magnetic memory element 1. In each memory cell including the magnetic memory element 1 and the MOS-FET, the upper electrode of the magnetic memory element 1 is connected to the word line WLi, which is a row line, and the lower electrode is connected to the bit line BLj, which is a column line, through the MOS-FET. In this way, the cross-point type memory cell array is configured. In the nonvolatile storage device 10 according to this embodiment, for example, the MOS-FET may be formed on a Si substrate in advance and the magnetic memory element 1 may be formed on the MOS-FET.

The maximum value of the process temperature required to manufacture the magnetic memory element 1 is about 350° C. which is required for an annealing treatment. Therefore, the performance of an electric pulse supply transistor or a cell selection switching MOS-FET that is provided below the magnetic memory element 1 is not damaged due to the process temperature. In addition, the line connected to the magnetic memory element 1 can be resistant to the temperature for an annealing treatment. Therefore, the magnetic memory elements 1 may be three-dimensionally stacked to increase memory capacity.

During a writing operation, a word line decoder 110 selects one of the word lines WLi (i=1 to n) corresponding to a word to be accessed, and a gate line decoder 130 selects one of the gate lines GLj (j=1 to l) corresponding to a gate to be accessed. A bit line decoder 120 applies a signal (pulse signal) corresponding to data to be written to the memory cell connected to the selected word line through the bit line BLj (j=1 to m). The MOS-FET in the cell that is not accessed prevents a current from flowing to the magnetic memory element 1 in the cell. The bit line decoder 120 applies a signal for performing a set operation or a reset operation according to data requiring writing between the bit line and the word line connected to the memory cell to be accessed. The set operation and the reset operation may be controlled by, for example, the polarity of the current or the pulse width of the current.

The bit line decoder 120 includes a current detecting unit (not shown) that is provided so as to correspond to each bit line. During a reading operation, similarly to the writing operation, the cell to be accessed is selected by the word line decoder 110 and the gate line decoder 130. The current detecting unit detects the current flowing from each bit line to the word line. A voltage value corresponding to the resistance of the magnetic memory element 1 which corresponds to each bit line is detected and the state of the magnetic memory element 1 is read on the basis of the voltage value.

The embodiments of the invention have been described above, but the invention is not limited thereto. Various kinds of modifications, changes, and combinations can be made on the basis of the technical spirit of the invention.

That is, the third embodiment shown in FIG. 7 has the structure in which the expansion and contraction layer 30 is added to the first embodiment shown in FIG. 1. However, the expansion and contraction layer 30 may be added to the second embodiment shown in FIG. 6.

The fourth embodiment has the structure in which the thermal expansion layer 28 according to the first embodiment is replaced with the thermal expansion layer made of a shape-memory alloy. However, the thermal contraction layer 29 according to the second embodiment shown in FIG. 6 may be replaced with a thermal contraction layer made of a shape-memory alloy. Of course, in this case, the thermal contraction layer is formed such that a change in the shape of the shape-memory alloy due to the writing current causes the contraction stress 101 shown in FIG. 6.

In the first embodiment, the thermal expansion layer 28 is inserted between the storage layer 20 and the upper electrode 12, but the invention is not limited thereto. That is, the thermal expansion layer 28 may be inserted into any position of the magnetic tunnel junction portion 13 shown in FIG. 1 as long as the stress 101 can occur in the storage layer 20. Similarly, the thermal contraction layer 29 according to the second embodiment shown in FIG. 6 may be inserted into any position of the magnetic tunnel junction portion 13.

In the first to fourth embodiments, the MOS-FET is formed in the Si wafer 15 and is used as an element selection switch. However, the MOS-FET may be replaced with a bipolar transistor. In addition, as shown in FIG. 11, the MOS-FET may be replaced with a diode D serving as a rectifying element (for example, see JP-A No. 2004-179483 and JP-A No. 2006-128579). In this case, the area of the magnetic memory element per bit is reduced from 6 $F^2$ to 4 $F^2$, and it is possible to increase density and reduce cost.

EXPLANATION OF LETTERS AND NUMERALS 1, 1-1 TO 1-3: MAGNETIC MEMORY ELEMENT
10, 10-1 TO 10-3: NONVOLATILE STORAGE DEVICE
11: BIT LINE
12: UPPER ELECTRODE
13: MTJ PORTION
14: LOWER ELECTRODE
15: Si SUBSTRATE
16: GATE LINE
17: CONTACT PORTION

18: WORD LINE
20: SECOND MAGNETIC BODY (STORAGE LAYER)
21: INSULATING LAYER
22: FIRST MAGNETIC BODY (PINNED LAYER)
23: INTERLAYER INSULATING FILM
24: DRAIN REGION
25: SOURCE REGION
28: THERMAL EXPANSION LAYER
29: THERMAL CONTRACTION LAYER
30: EXPANSION AND CONTRACTION LAYER
101: ARROW INDICATING DIRECTION OF STRESS
102, 102A, 102B: ARROW INDICATING MAGNETIZATION DIRECTION
103: ARROW INDICATING DIRECTION OF CURRENT
110: WORD LINE DECODER
120: BIT LINE DECODER
130: GATE LINE DECODER

The invention claimed is:

1. A magnetic memory element comprising:
a magnetic tunnel junction having a first magnetic body including a perpendicular magnetization film, an insulating layer, and a second magnetic body serving as a storage layer including a perpendicular magnetization film, the first magnetic body, the insulating layer and the second magnetic body being sequentially stacked in the stated order, wherein a current flows through the magnetic tunnel junction to change a magnetization direction of the second magnetic body relative to the first magnetic body, thereby regulating a resistance value of the insulating layer;
a first electrode that is provided on a side of the first magnetic body;
a second electrode that is provided on a side of the second magnetic body; and
a thermal expansion layer that is disposed in contact with the magnetic tunnel junction,
the second magnetic body being deformed in a direction in which a cross section thereof increases by thermal expansion of the thermal expansion layer due to heat generated by a flow of said current, thereby reducing a switching current threshold value required to change said magnetization direction.

2. The magnetic memory element according to claim 1, wherein the thermal expansion layer is made of a material with a linear thermal expansion coefficient that is more than that of the second magnetic body in a temperature range from room temperature to 200° C., and the thermal expansion layer is inserted between the second magnetic body and the second electrode.

3. The magnetic memory element according to claim 1, further comprising an expansion and contraction layer that is provided so as to come into contact with at least a side surface of the thermal expansion layer and enhance the expansion of the thermal expansion layer.

4. The magnetic memory element according to claim 3, wherein the expansion and contraction layer is formed so as to come into contact with a side surface of the second magnetic body, and the product of the coefficient of thermal expansion and the Young's modulus of the expansion and contraction layer is less than that of the second magnetic body.

5. The magnetic memory element according to claim 1, wherein the thermal expansion layer is made of a shape-memory alloy.

6. A magnetic memory element comprising:
a magnetic tunnel junction having a first magnetic body including an in-plane magnetization film, an insulating layer, and a second magnetic body serving as a storage layer including an in-plane magnetization film, the first magnetic body, the insulating layer and the second magnetic body being sequentially stacked in the stated order, wherein a current flows through the magnetic tunnel junction to change a magnetization direction of the second magnetic body relative to the first magnetic body, thereby regulating a resistance value of the insulating layer;
a first electrode that is provided on a side of the first magnetic body;
a second electrode that is provided on a side of the second magnetic body; and
a thermal contraction layer that is disposed in contact with the magnetic tunnel junction,
the second magnetic body is deformed in a direction in which a cross section thereof is reduced by a thermal contraction of the thermal contraction layer due to heat generated by a flow of said current, thereby reducing a switching current threshold value required to change said magnetization direction.

7. The magnetic memory element according to claim 6, wherein the thermal contraction layer is made of a material with a linear thermal expansion coefficient that is less than that of the second magnetic body in a temperature range from room temperature to 200° C., and the thermal contraction layer is inserted between the second magnetic body and the second electrode.

8. The magnetic memory element according to claim 6, further comprising an expansion and contraction layer that is provided so as to come into contact with at least a side surface of the thermal contraction layer and enhance the contraction of the thermal contraction layer.

9. The magnetic memory element according to claim 8, wherein the expansion and contraction layer is formed so as to come into contact with a side surface of the second magnetic body, and the expansion and contraction layer has a Young's modulus less than that of the second magnetic body and has a coefficient of thermal expansion more than that of the second magnetic body.

10. The magnetic memory element according to claim 6, wherein the thermal contraction layer is made of a shape-memory alloy.

11. A nonvolatile storage device comprising:
the magnetic memory element according to claim 6;
a switching element or a rectifying element that is connected in series to the magnetic memory element;
an information rewriting unit that supplies a writing current to the magnetic memory element to perform writing and erasing; and
a reading unit that reads stored information from the amount of current flowing through the magnetic memory element.

12. The magnetic memory element according to claim 10, wherein the shape-memory alloy is NiTiCu, NiTi, or CuZnAl.

13. The magnetic memory element according to claim 8, wherein the expansion and contraction layer enhances the contraction of the thermal contraction layer by accelerating the contraction of the thermal expansion layer.

14. The magnetic memory element according to claim 5, wherein the shape-memory alloy is NiTiCu, NiTi, or CuZnAl.

15. The magnetic memory element according to claim 3, wherein the expansion and contraction layer enhances the expansion of the thermal expansion layer by accelerating the expansion of the thermal expansion layer.

16. A nonvolatile storage device comprising:
the magnetic memory element according to claim 1;
a switching element or a rectifying element that is connected in series to the magnetic memory element;
an information rewriting unit that supplies a writing current to the magnetic memory element to perform writing and erasing; and
a reading unit that reads stored information from the amount of current flowing through the magnetic memory element.

* * * * *